(12) United States Patent  
Bruno

(10) Patent No.: US 7,359,809 B2
(45) Date of Patent: Apr. 15, 2008

(54) ELECTRICITY METERING WITH A CURRENT TRANSFORMER

(75) Inventor: David A. Bruno, Portland, OR (US)

(73) Assignee: Veris Industries, LLC, Portland, OR (US)

( * ) Notice: Subject to any disclaimer, the term of this patent is extended or adjusted under 35 U.S.C. 154(b) by 0 days.

(21) Appl. No.: 11/202,479

(22) Filed: Aug. 11, 2005

(65) Prior Publication Data

US 2006/0095219 A1    May 4, 2006

Related U.S. Application Data

(60) Provisional application No. 60/613,868, filed on Sep. 28, 2004.

(51) Int. Cl.
*G01R 21/06* (2006.01)

(52) U.S. Cl. .............. 702/64; 65/61; 65/60; 65/57; 324/142; 324/103 R; 324/141; 340/870.04; 340/870.01; 340/870.02

(58) Field of Classification Search ............... 702/60, 702/61, 62, 64, 65; 340/870.01, 870.02, 340/870.04; 324/74, 141, 142, 86, 247, 127, 324/103 R; 701/60, 61, 64

See application file for complete search history.

(56) References Cited

U.S. PATENT DOCUMENTS

| | | | |
|---|---|---|---|
| 5,563,506 A * | 10/1996 | Fielden et al. | 324/142 |
| 6,504,357 B1 * | 1/2003 | Hemminger et al. | 324/142 |
| 6,636,028 B2 * | 10/2003 | Lavoie et al. | 324/74 |
| 6,815,942 B2 * | 11/2004 | Randall et al. | 324/142 |
| 6,988,043 B1 * | 1/2006 | Randall | 702/61 |
| 2005/0240362 A1 * | 10/2005 | Randall | 702/61 |
| 2006/0085144 A1 * | 4/2006 | Slota et al. | 702/57 |

* cited by examiner

*Primary Examiner*—Carol S. W. Tsai
(74) *Attorney, Agent, or Firm*—Chernoff, Vilhauer, McClung & Stenzel

(57) ABSTRACT

The data storage and processing resources required for an electric meter are reduced by basing the selection and application of phase error correction on a root mean square load current flowing through the meter.

17 Claims, 4 Drawing Sheets

ELECTRICITY METERING WITH A CURRENT TRANSFORMER

CROSS-REFERENCE TO RELATED APPLICATIONS

This application claims the benefit of U.S. Provisional Application No. 60/613,868, filed Sep. 28, 2004.

STATEMENT REGARDING FEDERALLY SPONSORED RESEARCH OR DEVELOPMENT

Not applicable.

BACKGROUND OF THE INVENTION

The present invention relates to electric power meters and, more particularly to an electric power meter that incorporates a current transformer.

Monitoring electrical energy usage is a fundamental function within any electric power distribution system and a primary concern of both consumers and providers of electric power. Electrical energy may be monitored for purposes of usage, equipment performance, and power quality. Volts, amps, watts, vars, power factor, harmonics, kilowatt hours, kilovar hours and other power related measurement parameters are commonly monitored. Typically, the voltage and current, measured at a location within the electric power distribution system, are used to determine the electrical parameters at that location.

Electronic metering of electrical energy typically relies on independent sensing of the load current and the supply voltage. These two quantities are continuously multiplied to calculate the instantaneous load power. Integrating the varying instantaneous load power with respect to time derives the accumulated energy usage. In general, supply voltage sensing can be accomplished with a resistive voltage divider. Load current sensing is more problematic, but is commonly performed with a current transformer.

A current transformer is connected to an electrical system so that the load current (or a shunt current representative of the load current) will flow through the primary winding of the transformer. Often a conductor of the load current is routed through the center of a toroidal current transformer core forming a single turn primary winding of the transformer. The secondary winding typically comprises multiple turns of wire wrapped around the cross-section of the toroidal core. The current in the secondary winding or secondary current is effectively driven from a constant current generator and produces a voltage in an instrument resistor. This voltage can be used to precisely measure the secondary current providing the basis for calculating the corresponding load current flowing in through the primary winding. Ideally, the secondary current is precisely equal to the load current in the primary winding divided by the number of turns in secondary winding. However, actual transformers are not ideal transformers and the magnetization of the core of the current transformer produces errors that reduce the accuracy of the readings produced by the meter.

Current transformer error comprises a phase error and a ratio error. Part of the current in the primary winding is used to magnetize the transformer core with the result that the secondary current is less than the product of the primary current and the ratio of turns in the primary and secondary windings (turn ratio). The ratio error ($r_e$) varies with the magnitude of the primary current ($I_1$) as follows:

$$r_e(\%) = K_3 + K_4(\log I_1) \quad (1)$$

where $K_3$ and $K_4$ are constants.

The effect of the ratio error is to alter the relationship between the magnitudes of the measured secondary current ($I_2$) and the primary current ($I_1$) from the theoretical relationship, that is:

$$I_1 = I_2(n) \quad (2)$$

where n=turns ratio, to the relationship:

$$I_1 = I'_2\left(n + \frac{nr_e}{100}\right) \quad (3)$$

where $I'_2$=measured secondary current

The magnitude of the measured secondary current ($I_2'$) is related to the theoretical secondary current ($I_2$), as follows:

$$I_2 = I'_2\left(1 + \frac{r_e}{100}\right) \quad (4)$$

In addition, the magnetization of the transformer core and windings causes a phase shift between the current in the primary winding and the current in the secondary winding. The resulting phase error (P) varies with the magnitude of the primary current ($I_1$) approximately according to the relationship:

$$P = K_1 + K_2(I_1^{-M}) \quad (5)$$

where M, $K_1$ and $K_2$ are constants

In practice M is often approximately equal to ½ and, consequently, a square root approximation can often be conveniently employed as part of the overall correction algorithm.

The values of the constants $K_1$, $K_2$, $K_3$, and $K_4$ depend upon the configuration of the particular current transformer. Factors such as core material and turns ratio affect the values of the constants which are typically ascertained by experiment with samples of a given core configuration. Typically, the values of $K_1$, $K_2$, $K_3$, and $K_4$ are determined for a particular transformer configuration or production batch by comparing the actual performance of a sample of the transformer configuration to the performance of a standard device when the secondary winding is connected in parallel to a particular impedance or burden.

Electronic electric power meters typically incorporate a data processing system, such as a microprocessor or programmable logic controller, to calculate the energy consumption from the measured secondary current values and the supply voltage. It is possible to substantially compensate for the phase error and ratio error by evaluating the error constants for the transformer configuration used in the meter and applying appropriate phase and ratio error correction factors when the instantaneous primary or load current is calculated by the meter's data processing system from a secondary current sample. However, the phase and ratio errors vary with the burden and the magnitude of the primary current. To obtain accurate results, the phase and ratio error correction factors must be available for all possible values of the instantaneous current in the meter's operating range when the meter is operated with an actual burden equal to the test burden with which the meter was calibrated. The error correction factors for a current transformer core configuration are commonly stored in the form of a table, a mathematical formula, or another form representing error correction as a function of the instantaneous primary current. Substantial data storage capacity is necessary to store the required data for correcting currents throughout the meter's operating range and substantial processing power is required to apply the appropriate correction factors to each of the instantaneous load currents calculated from the secondary current samples. In addition, the error correction factors are generated from a sample of a particular transformer configuration and are not necessarily representative and accurate for a specific transformer used in a particular meter.

What is desired, therefore, is a method of accurately determining load current in the primary winding of a current transformer while reducing the computational and data storage resources required for an electric power meter.

DETAILED DESCRIPTION OF THE INVENTION

Figure 1:
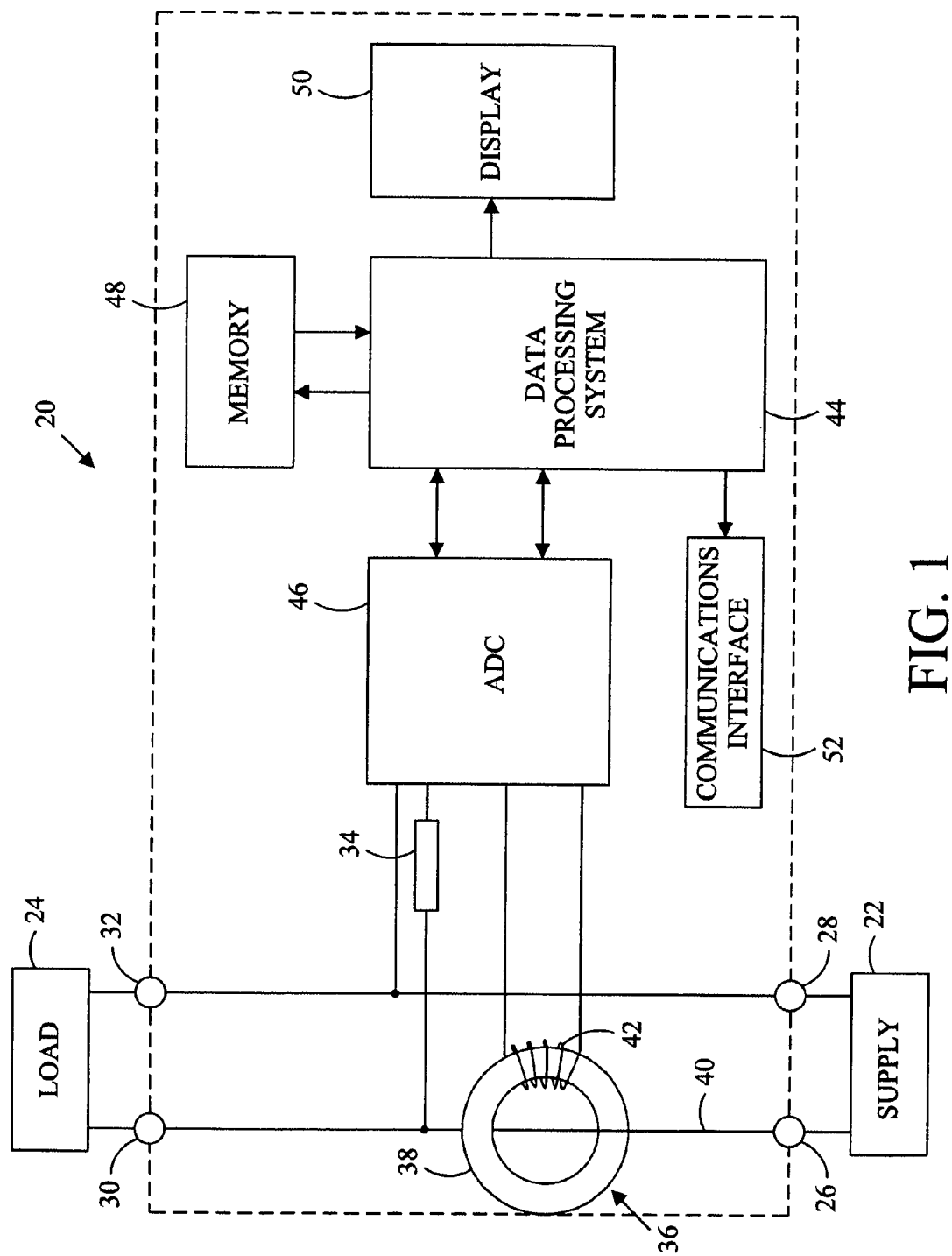
FIG. 1 is a block diagram of an electric power meter incorporating a current transformer.

Referring in detail to the drawings where similar parts of the invention are identified by like reference numerals, and more particularly to FIG. 1, an electrical power meter 20 is adapted for connection between a supply 22 and a load (or loads) 24 of an electrical distribution system via input terminals 26, 28 and output terminals 30, 32. The supply voltage is sensed through a voltage transducer 34, such a voltage divider resistor and the load current is sensed by a current transducer, commonly a current transformer 36. The exemplary current transformer 36 comprises a toroidal core 38 with conductive wire wrapped around the cross-section of the core to form a secondary winding 42. A conductor 40 connecting the supply terminal 26 to the load terminal 30 and passing through the aperture in the center of the toroidal core 38 comprises the primary winding of the current transformer 36. The primary winding has $N_1$ (commonly, $N_1$=1) turns and the secondary winding has $N_2$ turns. Thus, the current transformer 36 has a turns ratio (n) of $N_1/N_2$.

The outputs from the current transformer 36 and the voltage transducer 34 are input to a data processing system through an analog-to-digital converter (ADC) 46. The data processing system comprises data processing device 44, typically, a microprocessor, programmable logic device (PLC), or digital signal processor, and related data storage and peripheral devices. The data processing device 44 is connected to a memory 48 that is adapted to store data used by (e.g. number of turns in the secondary winding etc.) the data processing device in calculating the current, voltage, power, and other related electrical parameters. The data processing device 44 is also connected to a display system 50 permitting display of the metered quantities. A user interface permitting manual selection of different metered quantities for display may be incorporated in the display section. Other peripheral devices, components, and features may be provided including, for example, a communications interface 52 that enables remote reporting of the meter results or transmission of instrument data to a remote data processing system.

The power consumed at a location in a power distribution circuit can be obtained by determining the instantaneous load current and supply voltage and summing the products of the instantaneous current and voltage over a time period. The instantaneous supply voltage is typically measured by periodically sampling the output of a voltage transducer. On the other hand, the instantaneous load current is typically calculated using values of secondary current obtained by periodically sampling the output of the secondary winding of a current transformer. The sampling is commonly controlled by a data processing system so that the sampling is performed at known times in relation to the waveform of the alternating current. Before calculating current based quantities to be output by the meter such as real power, total power, reactive power etc., the data processing system typically adjusts the value of the instantaneous load current to compensate for the effects of phase error and ratio error introduced by the current transformer.

Typically, an initial or assumed value of the primary or load current is determined from the measured secondary using the theoretical relationship of the primary current and the secondary current for an ideal transformer:

$$I_1 = I_2(n) \quad (2)$$

where:
$I_1$=the primary current
$I_2$=the secondary current
n=turns ratio

The data processing system then uses the assumed load current to access one or more ratio and phase error correction factors that are typically stored in a memory and, using a correction algorithm, applies the correction factors to the assumed load current to calculate the adjusted or actual load current.

Figure 2:
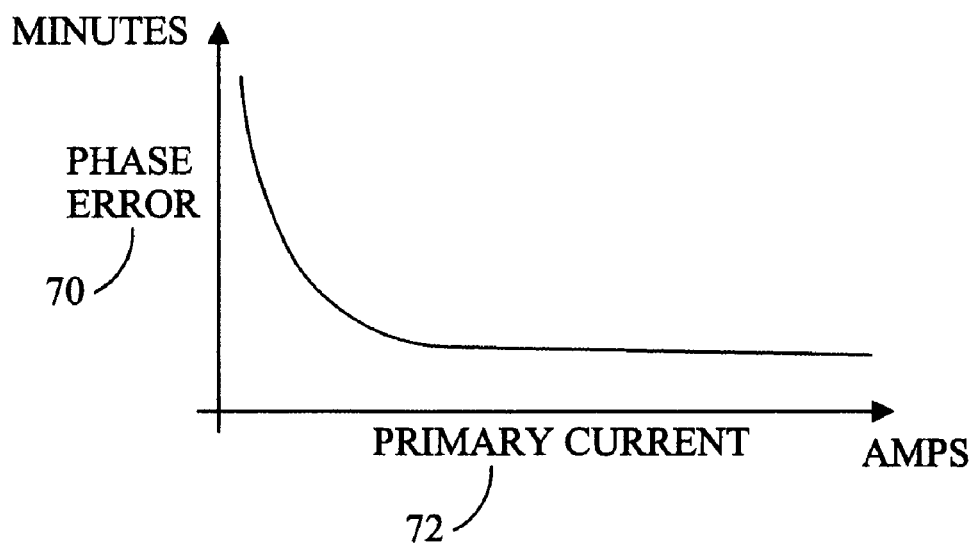
FIG. 2 is a graph of phase error versus primary current for an exemplary current transformer.
Figure 3:
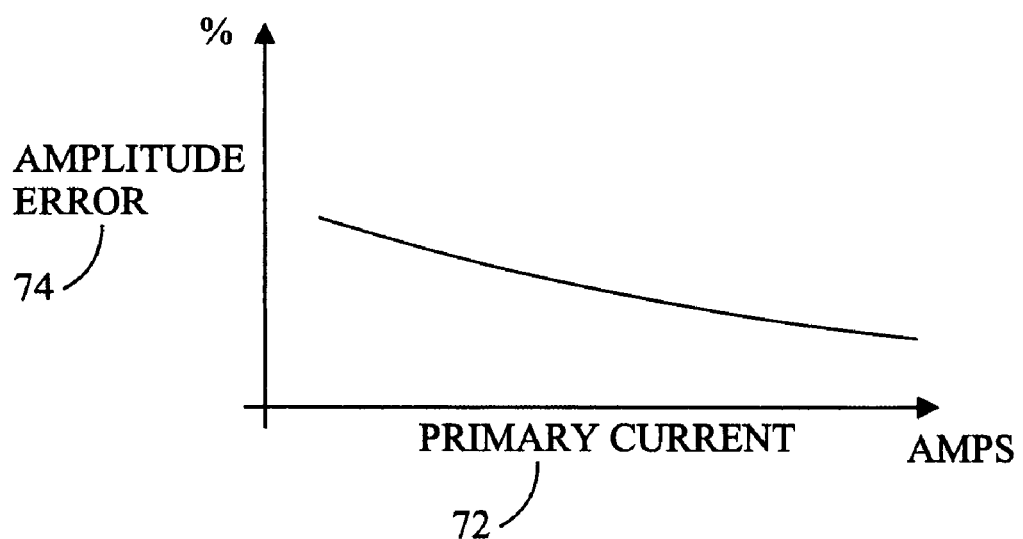
FIG. 3 is a graph of ratio error versus primary current for an exemplary current transformer.

The ratio and phase errors are obtained by testing a sample transformer having a core configuration that matches the core configuration of the current transformer used in the meter. Referring to FIGS. 2 and 3, the performance of the sample transformer, when operated with a known impedance or test burden connected to the secondary winding, is compared to the performance of a standard device to determine the characteristic curves of the phase error 70 and ratio error 74 which vary with primary current 72. Phase and ratio correction factors, fitting the characteristic curves obtained by testing, are typically stored as a table or an equation that is accessible to the meter's data processing system. From the assumed load current, the data processing system selects or calculates the appropriate ratio and phase error correction factors to be applied when adjusting an assumed load current in a manner defined by the meter's current adjustment algorithm.

Accurate metering requires a correction factor or factors appropriate for each instantaneous primary current value within the range of the meter's current rating when the meter is operated with an actual burden that matches the impedance of the test burden. A substantial quantity of data must be the stored and accessed so that appropriate correction factors will be available for all assumed load currents within the meter's range or additional computing resources must be provided to calculate the correction factors from an equation whenever a new assumed load current is calculated. In either event, considerable calculating resources are required to calculate an adjusted load current for each assumed load current calculated from a secondary current sample. In addition, the correction factors are obtained by testing samples of similarly configured transformers and are not necessarily accurate for the specific transformer used in a particular meter. The present inventor realized that the root mean square (rms) of the load current changes more slowly and over a narrower range than the instantaneous load current and that the computational and data storage requirements of a power meter could be reduced if the phase correction could be determined from the rms value of the assumed load current.

Figure 4:
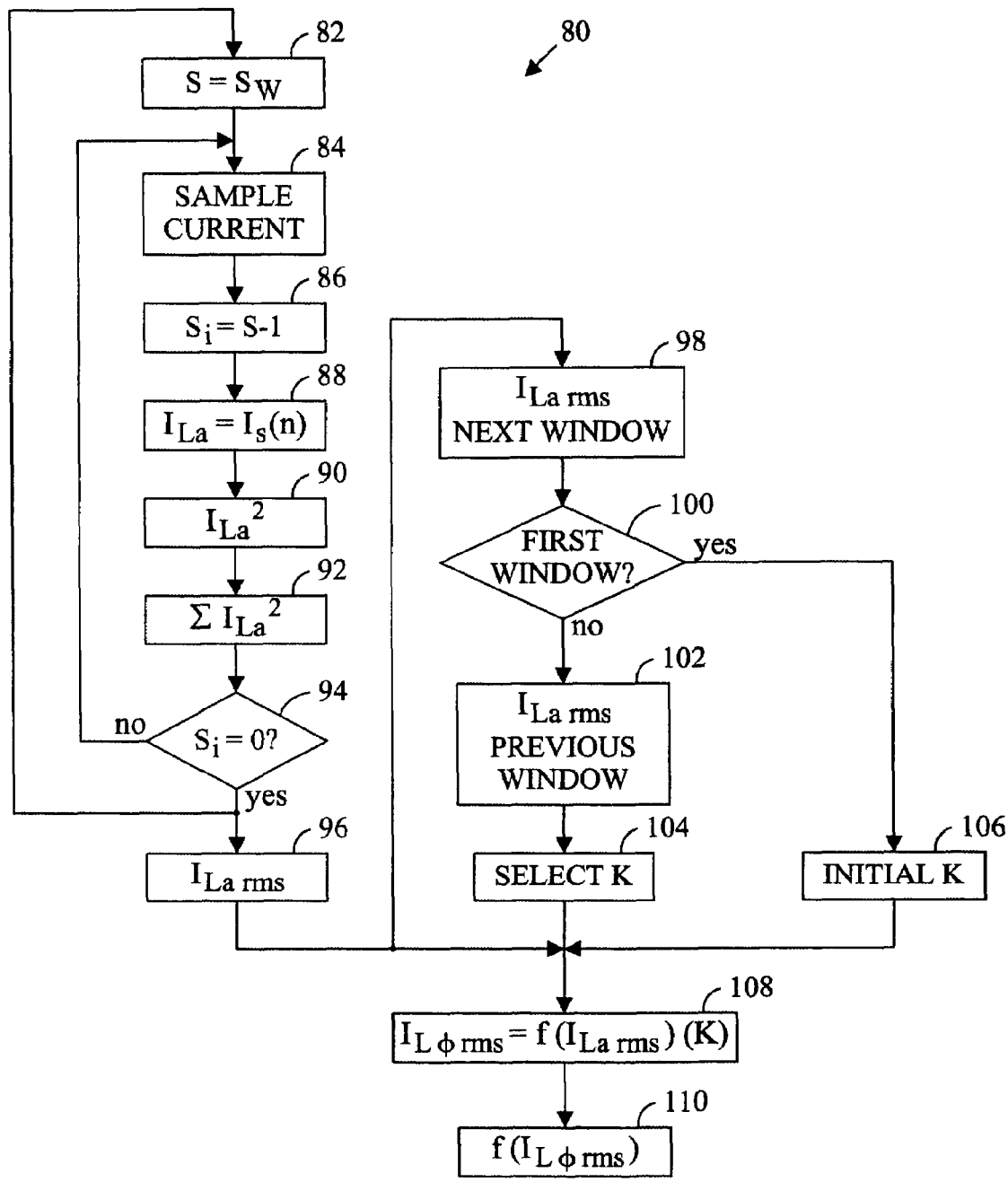
FIG. 4 is a flow diagram of a method of determining load current in an electric power meter incorporating a current transformer.

In the power meter 20, the instantaneous load current is determined from periodic samples of the current induced in the secondary winding 42 of the current transformer 38 by the load current flowing in primary winding, the conductor 40. Referring to FIG. 4, when the data processing device 44 initializes a sample counter to a predetermined number of samples to be included in a sampling window 82, the method of determining the load current 80 is initiated. The secondary current is sampled 84 and the sample counter is decremented 86. The assumed or instantaneous load current ($I_{La}$) for an ideal transformer is calculated by multiplying the sample secondary current ($I_s$) by the turns ratio (n) of the current transformer 36. The assumed load current is squared 88 and the result is added to the sum of the squared assumed load currents 90 accumulated for preceding samples in the sampling window. If the accumulated number of samples is less than the number of samples specified for a sampling window 90, the data processing system samples the secondary current again at the appropriate time 84, decrements the sample counter 86, and repeats the calculations in steps 88, 90, 92.

When the number of samples equals the number of samples specified for a sampling window 94, the sample counter is reset 82 and the root mean square (rms) of the assumed load currents accumulated for the sampling window is calculated 96. The rms assumed load current is equals:

$$I_{Larms} = \sqrt{\frac{\sum I_{La}^2}{s_w}} \quad (6)$$

where:
$I_{La\ rms}$=the root means square of the assumed load current
$I_{La}^2$=the square of the assumed load current
$s_w$=the number of samples in the sampling window The calculated rms assumed load current 96 is stored as the anticipated rms assumed load current for the next sampling window 98. If the present sampling window is the initial sampling window 100, one or more predetermined phase correction factors (K) are selected by the data processing system 44. The phase correction factor K provides a relationship to adjust the phase of sensed current If the present sampling window is not the initial sampling window 100, the rms assumed current from the previous sampling window is retrieved from memory 102 and used to select or calculate one or more corresponding phase correction factors (K) for the current sampling window 104. The initial or selected phase correction factor(s) is input to a phase correction algorithm to determine the phase corrected rms load current ($I_{L\Theta rms}$) 108 which is used by the data processing device 44 to calculate other functions of the rms load current 110 such as the power.

Phase error is current dependent and the data storage and processing resources of an electric meter can be reduced if the rms load current is used as the basis for the selection and application of phase error correction.

Figure 5:
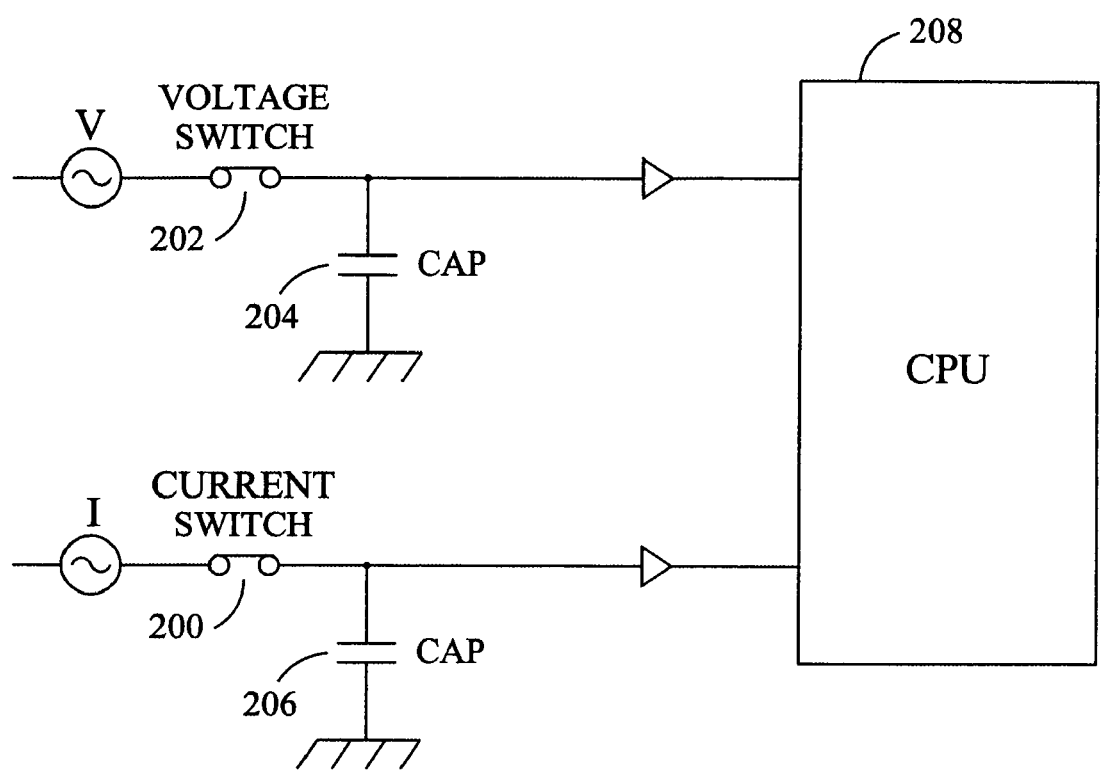
FIG. 5 illustrates another power metering system.

Referring to FIG. 5, another embodiment for phase adjustment is illustrated. Initially the current switch 200 and the voltage switch 202 are both closed so that a charge is imposed across the voltage capacitor 204 and the current capacitor 206. Then the current switch 200 is opened while the voltage switch 202 remains closed. In this manner the voltage level at the current switch 204 imposed across the current capacitor 206 is maintained across the current capacitor. This voltage level across the current capacitor 206 may be sensed by a processor 208.

When sufficient time has lapsed to adjust for the phase shift of the current as a result of the transformer, which may be determined based upon $I_{RMS}$, the voltage switch 202 is opened. Other measures to determine the appropriate temporal delay in the sampling may likewise be used, as desired. The voltage at the time of opening the voltage switch 202 is maintained across the voltage capacitor 204. The current switch 200 may be maintained opened, if desired. In this manner the voltage level at the voltage switch 202 imposed across the voltage capacitor 204 is maintained across the voltage capacitor. This voltage level across the voltage capacitor 204 may be sensed by the processor 208.

The sensed current level from the current capacitor 206 and the sensed voltage level from the voltage capacitor 206 may be used to determine the power. Thereafter, the switches 202 and 200 are preferably closed. A data set collected from sampling the current levels may be used to determine $I_{RMS}$, which may be used to calculate the temporal offset in the sampling of the voltage and current levels. Other switching configurations may likewise be used, as desired.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A method for a power meter for measuring a load current in a conductor of said power meter, the method comprising the steps of:
   (a) said power meter determining a phase error correction factor corresponding to a root mean of the square of a load current from a first plurality of sampled currents;
   (b) said power meter determining a root mean of the square of a load current from a second plurality of sampled currents;
   (c) said power meter computing a phase adjusted root mean of the square load current from said root mean of the square of the load current for said second plurality of sample currents and said phase error correction factor;

(d) said power meter providing an indication of the value of said adjusted load current.

2. A method for a power meter for measuring a load current in a conductor of said power meter, the method comprising the steps of:
  (a) said power meter determining a first root mean of the square load current from a first plurality of sample currents;
  (b) said power meter determining a second root mean of the square load current from another plurality of sample currents;
  (c) said power meter determining a phase correction factor corresponding to said first root mean of the square load current;
  (d) said power meter determining a phase corrected root mean of the square load current from said second root mean of the square load current and said phase correction factor;
  (e) said power meter providing an indication of the value of said load current.

3. The method of measuring current for said power meter of claim 2 wherein the step of determining a root mean of the square load current from a plurality of sample currents comprises the steps of:
  (a) said power meter sampling a secondary current induced in a winding of a current transformer by said load current;
  (b) said power meter computing an assumed load current corresponding to said secondary current of said sample;
  (c) said power meter squaring said assumed load current;
  (d) said power meter repeating steps (a)-(c); and
  (e) said power meter computing a square root of an average a plurality of squared assumed load currents and providing an indication of said load current.

4. The method for said power meter of measuring a load current of claim 3 wherein the step of computing an assumed load current corresponding to a sampled secondary current comprises the step of computing the product of said sample secondary current and a turns ratio of said current transformer.

5. The method for said power meter of measuring current of claim 2 wherein the step of determining a phase correction factor corresponding to said first root mean of the square current comprises the step of selecting a phase correction factor from a table comprising a plurality of phase correction factors and a plurality of respectively corresponding root mean of the square currents.

6. The method for said power meter of measuring current of claim 2 wherein the step of determining a phase correction factor corresponding to said first root mean of the square load current comprises the step of calculating a phase correction factor from an equation expressing a mathematical relationship of said phase correction factor and a root mean of the square current.

7. The method for said power meter of measuring a current of claim 1 further comprising the step of, at least one of, displaying said phase adjusted root mean load current and using said phase adjusted root mean load current in a determination of another displayable metric of electricity.

8. A method for said power meter of measuring current in an electrical distribution system for a power meter, said method comprising the steps of:
  (a) said power meter periodically sampling a secondary current in a winding of a current transformer;
  (b) said power meter calculating an assumed load current from said sample secondary current;
  (c) said power meter repeating steps (a) and (b) for a first plurality of samples of said secondary current;
  (d) said power meter calculating a first root mean of the square of said assumed load currents from said first plurality of samples;
  (e) said power meter repeating steps (a) and (b) for a second plurality of samples of said secondary current;
  (f) said power meter calculating a later root mean of the square of said assumed load currents from said second plurality of samples of secondary current;
  (g) said power meter determining a phase correction factor corresponding to said first root mean of the square assumed load current,
  (h) said power meter calculating an adjusted load current from said later root mean of the square assumed load current and said phase correction factor;
  (j) said power meter providing an indication of the value of said adjusted load current.

9. The method for said power meter of measuring current of claim 8 wherein the step of determining a phase correction factor corresponding to said first root mean of the square current comprises the step of selecting a phase correction factor from a table comprising a plurality of phase correction factors and a respectively corresponding plurality of root mean of the square currents.

10. The method for said power meter of measuring current of claim 8 wherein the step of determining a phase correction factor corresponding to said first root mean of the square current comprises the step of calculating a phase correction factor from an equation expressing a mathematical relationship of said phase correction factor and said root mean of the square current.

11. The method for said power meter of measuring a current of claim 8 further comprising the step of, at least one of, displaying said adjusted load current and using said adjusted load current in a determination of another displayable metric of electricity.

12. A meter for measuring a load current in a conductor of a power meter, the meter comprising:
  (a) a current transformer including a primary winding and a secondary winding, said load current inducing a secondary current in said secondary winding; and
  (b) a data processing system that:
    (i) periodically samples said secondary current;
    (ii) calculates a first root mean of the square of assumed load currents from a first plurality of samples of said secondary current;
    (iii) determines a phase correction factor corresponding to said first root mean of the square assumed load current;
    (iv) calculates a second root mean of the square of assumed load currents from a temporally later second plurality of samples of said secondary current; and
    (v) calculates a phase adjusted load current from said second root mean of the square assumed load current and said phase adjustment factor;
  (c) said meter providing an indication of the value of said adjusted load current.

13. The meter of claim 12 further comprising a memory for storing a plurality of phase adjustment factors and a plurality of respectively corresponding root mean square of the current values.

14. The meter of claim 12 further comprising a memory accessible by said data processing system, said memory storing an equation relating said phase adjustment factor to said root mean of the square current, said equation used by said data processing system to calculate said phase adjustment factor from said first root mean square of the load current.

15. The meter of claim 12 further comprising a display operatively connected to said data processing system to enable display of said phase adjusted load current.

16. The meter of claim 12 wherein said data processing system utilizes said phase adjusted load current to compute another electricity metric.

17. The meter of claim 16 wherein said another electricity metric is an electric power of said current.

* * * * *

UNITED STATES PATENT AND TRADEMARK OFFICE
CERTIFICATE OF CORRECTION

PATENT NO. : 7,359,809 B2
APPLICATION NO. : 11/202479
DATED : April 15, 2008
INVENTOR(S) : David Bruno Page 1 of 1

It is certified that error appears in the above-identified patent and that said Letters Patent is hereby corrected as shown below:

Col. 4, Line 62
Change "be the stored" to --be then stored--.

Col. 5, line 57
Change "current If the" to --current. If the--.

Col. 7, Line 34 (Claim 3)
Change "average a plurality" to --average of a plurality--.

Col. 8, Line 17 (Claim 8)
Change "(j) said power meter" to --(i) said power meter--.

Signed and Sealed this

Thirtieth Day of June, 2009

JOHN DOLL
*Acting Director of the United States Patent and Trademark Office*